United States Patent
Kabler et al.

(10) Patent No.: US 9,823,283 B2
(45) Date of Patent: Nov. 21, 2017

(54) MULTI-NODE ELECTRICAL POWER MONITORING, ANALYSIS, AND RELATED SERVICES

(71) Applicant: Alarm.com Incorporated, Tysons, VA (US)

(72) Inventors: Ronald Byron Kabler, Prairie Village, KS (US); Robert Leon Lutes, Lawrence, KS (US); Alain Charles Briancon, Poolesville, MD (US); Curtis Scott Crawford, Overland Park, KS (US); Christopher Allen Giacoponello, Pottstown, PA (US); Jerald Frederic Johnson, Lawrence, KS (US); Victor Andres Jara-Olivares, Overland Park, KS (US); Marc Anthony Epard, Lawrence, KS (US); Steven Jeffrey Goldberg, Delray Beach, FL (US); John Berns Lancaster, Lawrence, KS (US)

(73) Assignee: Alarm.com Incorporated, Tysons, VA (US)

( * ) Notice: Subject to any disclaimer, the term of this patent is extended or adjusted under 35 U.S.C. 154(b) by 0 days.

(21) Appl. No.: 15/489,367

(22) Filed: Apr. 17, 2017

(65) Prior Publication Data
US 2017/0219637 A1    Aug. 3, 2017

Related U.S. Application Data

(63) Continuation of application No. 15/166,713, filed on May 27, 2016, now Pat. No. 9,625,518, which is a (Continued)

(51) Int. Cl.
*G01R 35/00* (2006.01)
*G01R 31/02* (2006.01)
(Continued)

(52) U.S. Cl.
CPC ............ *G01R 21/06* (2013.01); *G01D 4/008* (2013.01); *G01R 31/2836* (2013.01);
(Continued)

(58) Field of Classification Search
CPC ..... G01R 31/2836; G01R 21/00; G06Q 50/06
(Continued)

(56) References Cited

U.S. PATENT DOCUMENTS

| | | |
|---|---|---|
| 5,818,238 A | 10/1998 | DeVilbiss |
| 2012/0068692 A1* | 3/2012 | Patel .................... G01R 15/207 324/202 |

OTHER PUBLICATIONS

U.S. Notice of Allowance for U.S. Appl. No. 14/200,884, dated Oct. 1, 2015, 15 pages.

* cited by examiner

*Primary Examiner* — Farhana Hoque
(74) *Attorney, Agent, or Firm* — Fish & Richardson P.C.

(57) ABSTRACT

The operation of electrical appliances receiving electrical power from an electrical system may be indirectly monitored using monitoring units engaged with outlets on branch circuits of the electrical system. Electrical systems providing power to appliances to be monitored in accordance with the present invention may comprise split phase alternating current systems, tri-phase systems, or any other type of electrical system. Known loads may be applied to calibrate the monitoring system. The monitoring system may measure the power consumption of appliances operating on the electrical system and/or detect possible fault conditions. The application of a known load to each phase of the electrical system for calibration permits different portions of the electrical system to be isolated and, therefor, provides improved accuracy in monitoring power consumption and detection of potential fault conditions.

20 Claims, 10 Drawing Sheets

Related U.S. Application Data continuation of application No. 14/200,884, filed on Mar. 7, 2014, now Pat. No. 9,354,271.

(60) Provisional application No. 61/821,855, filed on May 10, 2013, provisional application No. 61/880,686, filed on Oct. 24, 2013.

(51) Int. Cl.
*G01R 21/06* (2006.01)
*G01R 31/28* (2006.01)
*G01D 4/00* (2006.01)
*G06Q 50/06* (2012.01)

(52) U.S. Cl.
CPC ....... *G01R 31/2837* (2013.01); *G01R 35/005* (2013.01); *G06Q 50/06* (2013.01)

(58) Field of Classification Search
USPC ................................ 324/202, 416, 511, 555
See application file for complete search history.

MULTI-NODE ELECTRICAL POWER MONITORING, ANALYSIS, AND RELATED SERVICES

CROSS-REFERENCE TO RELATED APPLICATIONS

This application is a continuation and claims the benefit of priority under 35 U.S.C. 120 of U.S. application Ser. No. 15/166,713 entitled "Multi-Node Electrical Power Monitoring, Analysis, and Related Services" filed May 27, 2016, now allowed, which is a continuation of U.S. application Ser. No. 14/200,884 entitled "Multi-Node Electrical Power Monitoring, Analysis, and Related Services" filed Mar. 7, 2014, now issued, which claims the benefit of U.S. provisional application Ser. No. 61/821,855 entitled "Self-Installed Energy Monitor and Associated Services" filed on May 10, 2013, the entirety of which is hereby incorporated by reference. This application also claims priority to U.S. provisional application Ser. No. 61/880,686 entitled "Self-Installed Energy Monitor and Associated Services" filed on Oct. 24, 2013, the entirety of which is incorporated by reference. This patent application is also related to U.S. patent application Ser. No. 14/200,756 filed on Mar. 7, 2014 entitled "Monitoring and Fault Detection of Electrical Appliances for Ambient Intelligence" and U.S. patent application Ser. No. 14/200,692 filed on Mar. 7, 2014, now U.S. Pat. No. 9,244,116, issued Jan. 26, 2016, entitled "Indirect Electrical Appliance Power Consumption Monitoring and Management," both of which are hereby incorporated by reference in their entirety.

BACKGROUND

Most homes and businesses, both within the United States and around the world, use electrical power to operate a wide variety of appliances. For example, in a typical home or business, electrical appliances may consume electrical power to operate motors, provide lighting, operate entertainment electronics, operate computing electronics, provide heating and/or cooling for a building, for use in food preparation, cleanup, and/or food storage, to heat water, and for various power conversion processes required to operate an appliance.

Typically, users of electrical power are billed by utility companies or other power providers in accordance with the amount of power consumed by a customer, which necessarily depends upon the power consumed by the utility customer's various electrical appliances. Therefore, consumers may desire to better understand and manage the power consumed by electrical appliances for economic reasons. Moreover, concerns regarding the environmental impact of the power generation process has led many consumers of electrical power to prefer to reduce their use of electrical power in order to reduce the negative impacts of electrical power generation upon the environment for reasons beyond the immediate benefits of potentially reduced electrical costs.

Further, the electrical appliances that consume electrical power in a typical home or business are, to varying degrees, prone to failure, malfunction or degradation in operational efficiency. Depending upon the particular appliance involved, malfunctions may be rare or common, and may be mildly inconvenient or catastrophic. While a malfunctioning entertainment device may be annoying, a malfunctioning washing machine or dishwasher can indicate a water leak that can affirmatively damage a structure. A malfunctioning heating or air conditioning system can lead to uncomfortable or even life threatening conditions. Further, some malfunctions involving electrical appliances or the electrical system of a structure itself may create a risk of power loss or, worse yet, fire. Ideally, an electrical malfunction would be identified quickly or, better yet, identified as an impending problem before the malfunction occurs.

Appliance monitoring systems and methods may be useful to consumers, appliance manufacturers, utility companies, and/or various service providers, among others. For example, appliance monitoring systems may be used to understand the power consumption patterns of appliances in a home or business, the better to reduce needless power consumption and attain efficiencies, automate home functions, determine consumer behavior, as well as to identify possible faults, malfunctions or degradations in efficiency at the earliest possible occasion to avoid inconvenient or even catastrophic appliance failures.

A variety of approaches are known for use in monitoring the power consumption and/or behavior of electrical appliances, but these known systems and methods suffer from significant obstacles to widespread adoption.

The most reliable way to monitor devices such as electrical appliances is to have each one built with internal sensors, and means to communicate their status to a central automated management or user interface operating on a convenient platform. Said platforms can be associated with the device or remote from it. While the decreasing costs of electronics and communication devices makes it practical to include such things in high cost new devices (e.g. refrigerators, air conditioners), it is not practical for low-cost items (e.g. toasters, basic lighting fixtures) and is likely to remain so for many years. Moreover, there exists a large installed base of electrical appliances for which retrofitting sensors would be technologically impractical and unreasonably expensive even if technically feasible. For this reason, the wide spread adoption of monitors integral to electrical appliances to provide information regarding the performance of those appliances is not likely in either the near or medium term.

An approach to monitoring the performance of electrical appliances without integral monitoring sensors is the use of various types of sensors in close proximity to the electrical appliance. For example, a monitoring unit may be interposed between the appliance and the outlet, thereby permitting the monitoring unit to measure the current and/or voltage at the outlet in order to observe and record power consumed through it by the appliance. In some instances, such monitoring units may be augmented by devices that detect vibrations, sounds, or other events that provide information with regard to the operation of the appliance to be monitored. Unfortunately, such an approach often requires a one-to-one correspondence between monitors and electrical appliances, which may be both expensive and impractical for most applications, particularly within a home environment. Moreover, a sophisticated monitor of this type may be difficult for most homeowners to properly install or maintain.

Another approach to monitoring the consumption of electrical power that may be practical in some businesses that intensively consume electrical power, but that may be difficult to cost-justify for homes and other entities that consume relatively low amounts of electrical power, is the installation of monitoring systems as an integral part of the building's electrical system. For example, monitoring systems may be integrated into the breaker box through which a building's electrical power is delivered, thereby permitting a reasonably close monitoring of the power consumed on the various circuits within a building. However, such an approach is impractical for most existing structures with existing electrical systems. Moreover, even for new construction, the integration of specialized energy monitoring units within a building's electrical system may be too expensive and impractical to use in most instances.

For these reasons, it is desirable to provide systems and methods that may be readily adapted to monitoring the power consumption and/or behavior of electrical appliances receiving power from a previously installed electrical system.

SUMMARY

The present invention provides systems and/or methods for monitoring the power consumption of electrical appliances that receive electrical power through an existing electrical system and/or for monitoring the behavior and performance of electrical appliances to detect behavior that may be indicative of a current or impending malfunction.

The present invention may be particularly useful in alternating current electrical systems. For example, the present invention may be utilized in split phase, tri-phase, and other alternating current (AC) electrical systems. Systems and methods in accordance with the present invention may be applied to electrical systems delivering AC power at 50 Hz, 60 Hz, and other frequencies. Systems and methods in accordance with the present invention may be applied to electrical systems to electrical systems delivering AC power at 100 V, 110 V, 115 V, 120 V, 127 V, 208 V, 220 V, 230 V, 240, and other nominal voltages. Systems and methods in accordance with the present invention may be applied to IEC 60309 systems. Each phase of the electrical power system providing power to the electrical appliances to be monitored may have one or more branch circuits. In accordance with one example of the present invention, at least one monitoring unit may be engaged with an outlet on one or more branch of each phase of a multi-phase alternating current electrical system, such that one or more monitoring unit is deployed on each phase of the electrical system. A split phase alternating current electrical system may have at least two monitoring units engaged with outlets on different phases, a tri-phase alternating current electrical system may have at least three monitoring units engaged with outlets on different phases, etc. However, systems and methods in accordance with the present invention may use more monitoring units (i.e., more than one monitoring unit on a single phase of an electrical system) or fewer monitoring units (i.e., no monitoring units on some phases of an electrical system) without departing from the scope of the present invention. Further, the present invention is independent of the shape of the outlet.

Typically, an electrical utility company or other service provider will deliver electrical power from a transformer or other electrical energy distribution point via multiple power lines (typically one line for each phase of the electrical system and a neutral line). A meter of some type will record the amount of electrical power provided as the multiple power lines enter the breaker box, fuse box, or similar component of the electrical system within the home or other structure. The breaker box (or fuse box, etc.) will typically provide an electrical ground and will provide circuits that provide electrical power to appliances through direct wiring (more typical for HVAC systems and other major appliances) or through electrical outlets. While most of the voltage drops between lines of an electrical circuit may be attributed to electrical loads of appliances drawing power from the system, the wires and other components of the electrical system itself, from the transformer through the breaker box to the appliance itself, consumes some power that may be accounted for in accordance with the present invention, thereby permitting improved accuracy in monitoring the electrical appliances operating on an electrical system.

An outlet of an electrical system may have three separate lines. A first line may carry power from one phase of the electrical system and may be referred to as the "hot" line, as it is the line that delivers electrical power to an appliance connected to that output. A second line may be a neutral line may be used to complete a circuit for an appliance engaged with that outlet. A third line may be a ground line and may be used to ground an appliance connected to the outlet for safe operation. Not all electrical systems provide a ground line. In accordance with the present invention, a monitoring unit may be engaged with an outlet and may monitor the voltage between the hot line and the neutral line and/or between the neutral line and the ground line of that outlet. Changes in the detected voltage between lines may be used to determine the loads placed upon the electrical system, for example by an appliance, which may then be used to determine the power consumed by an operating electrical appliance and to obtain a voltage profile describing the operation of an appliance operating on the electrical system.

The monitoring units engaged with one or more outlet of an electrical system in accordance with the present invention may be calibrated through the application of an electrical load having known properties to the electrical system. Because the applied load has known properties, the resulting voltage change may be used to provide a model for the electrical system, for example in ways described further herein. In examples described herein, the calibration load having known electrical properties may be a component of one or more of the monitoring units themselves, although one or more calibration load may optionally be provided as an independent component of systems in accordance with the present invention. The calibration load may be a current source, a voltage source, a power source (e.g. adjusts current draw until a voltage indicative of a specific power consumption occurs), a resistive load, or reactive load, or a combination thereof. While the calibration load may be constant, in other words apply the same load when switched on or otherwise placed in an active state, the calibration load may also vary in a known or controlled fashion when in an active state. When in an inactive or unapplied state, the calibration load will apply either no load or a negligible load to the electrical system.

The calibration performed by monitoring units engaged with outlets of an electrical system in accordance with the present invention may proceed in a coordinated fashion such that at least one calibration load is applied to each phase of the electrical system. Each monitoring unit may measure the change in voltage at that monitoring unit's outlet between the hot and neutral lines and between the neutral and ground lines as each calibration load having known electrical properties is applied to the electrical system. By analyzing the voltage changes that occur between the hot and neutral lines and between the neutral and ground lines while calibration loads having known electrical properties are applied to each of the phases of the electrical system, the voltage drop attributed to the electrical system itself, rather than appliances operating on the electrical system, may be identified and accounted for in the identification, characterization, and analysis of electrical appliances operating on the electrical system. The sequential application of calibration loads may be coordinated in a variety of fashions, some examples of which are described herein. While examples of the sequential application of single calibration loads are described herein, the simultaneous application of calibration loads, either on a single phase or different phases of an electrical system, may be performed to obtain additional information regarding the electrical system without departing from the scope of the present invention.

Information describing the voltage measurements made by a monitoring unit, whether as part of a calibration process or in the regular operation of the monitoring unit, may be stored in one or more digital medium. The information retained in a digital storage medium may be discrete voltage measurements, potentially with appropriate time stamps associated with them and or information describing the attributes of any calibration load applied to the electrical system in conjunction with those measurements, but may additionally/alternatively comprise a quantification of the amount by which the observed voltage changed in response to an applied electrical load. The use of the change in voltage associated with an event such as the application of an electrical load to the system, whether due to a calibration process or the use of an appliance, rather than a large number of discrete voltage measurements may result in more efficient data storage and retention while providing sufficient information to calibrate and operate systems and methods in accordance with the present invention. While individual and discrete voltage measurements may be used in systems and methods in accordance with the present invention, multiple measurements may be made and combined in a fashion to provide improved accuracy and/or precision, as well as to address the inherently noisy environment of a typical electrical system. One way of combining multiple voltage measurements is to use a simple averaging technique, but other combinations of multiple measurements may be used without departing from the scope of the present invention. Moreover, whether individual or multiple voltage measurements are used, and however possible multiple measurements are combined, various linear and/or non-linear filtering techniques may be implemented to within the scope of the present invention.

One or more processing units may control the application of calibration loads having known electrical properties, the measurement of voltages or voltage changes by a monitoring unit, the storage of information in any digital storage medium, communications between one or more monitoring units or other devices. A processing unit may also perform all or part of the analysis of collected data for both calibration and monitoring purposes.

One or more communication interfaces may permit one monitoring unit, for example a monitoring unit on a first branch circuit, to communicate with another monitoring unit, for example a monitoring unit on a second branch circuit. A communication interface may also permit a monitoring unit to exchange data with other devices. Other devices may comprise, for example, a computing device such as a smart phone, a tablet computer, a personal computer, a remote server, or any other type of device. In some examples, varying amounts of the operation of systems and methods in accordance with the present invention may occur at one or more computing devices. For example, one or more computing device may perform part or all of the functions of a processing unit or digital storage medium.

One or more databases may be used to provide information useful in accordance with the present invention for monitoring the power consumption and operation status of various appliances receiving electrical power from an electrical system. For example, a database may provide information describing the likely voltage or power signatures of appliances that are likely to be operating on an electrical system. One or more processing unit may compare information describing likely voltage or power signatures found in such a database to the voltage or power signatures actually detected and retained in one or more digital storage medium to assist in identifying appliances operating on the electrical system. In a similar fashion, voltage or power signatures corresponding to potential fault conditions may be provided in the same or a different database, as well as other information such as may be needed to initiate a transaction related to a detected malfunction. One or more databases of such a type may be retained in an appropriate digital form on a monitoring unit itself or on a computing device. In some instances, some information may be retained in a database on the monitoring unit itself, further information may be retained in a database in a computing device in convenient and frequent communication with the monitoring unit (such as in an application or "app" installed on a home owner's mobile phone or tablet), and yet further information that may be less frequently needed or subject to more frequent updating may be retained on a remote server accessed over an internet connection.

BRIEF DESCRIPTION OF THE SEVERAL VIEWS OF THE DRAWINGS

Examples of systems and methods in accordance with the present invention are described in conjunction with the attached drawings, wherein.

DETAILED DESCRIPTION

Examples of systems and methods in accordance with the present invention are described in relation to the attached drawings. The drawings represent only particular examples of possible implementations of the present invention, and are not limiting in nature. Systems and methods in accordance with the present invention may be practiced or implemented in ways other than the examples depicted without departing from the scope of the present invention.

In accordance with the present invention, voltage measurements may be made between the hot and neutral lines and between the neutral and ground lines at least one outlet on each individual phase of an alternating current electrical system. An alternating current electrical system may be, for example, a split phase electrical system, a tri-phase electrical system, etc. Voltage measurements may be made by one or more monitoring units engaged with one or more outlets of the electrical system. While monitoring units may permit appliances to receive electrical power through the monitoring unit, for example by plugging in to the monitoring unit, by measuring changes in voltage at the outlet the monitoring unit may monitor the operation of appliances receiving electrical power from other outlets on the electrical system, thereby avoiding the need for a one-to-one correspondence of monitoring units to the appliances to be monitored.

Figure 1:
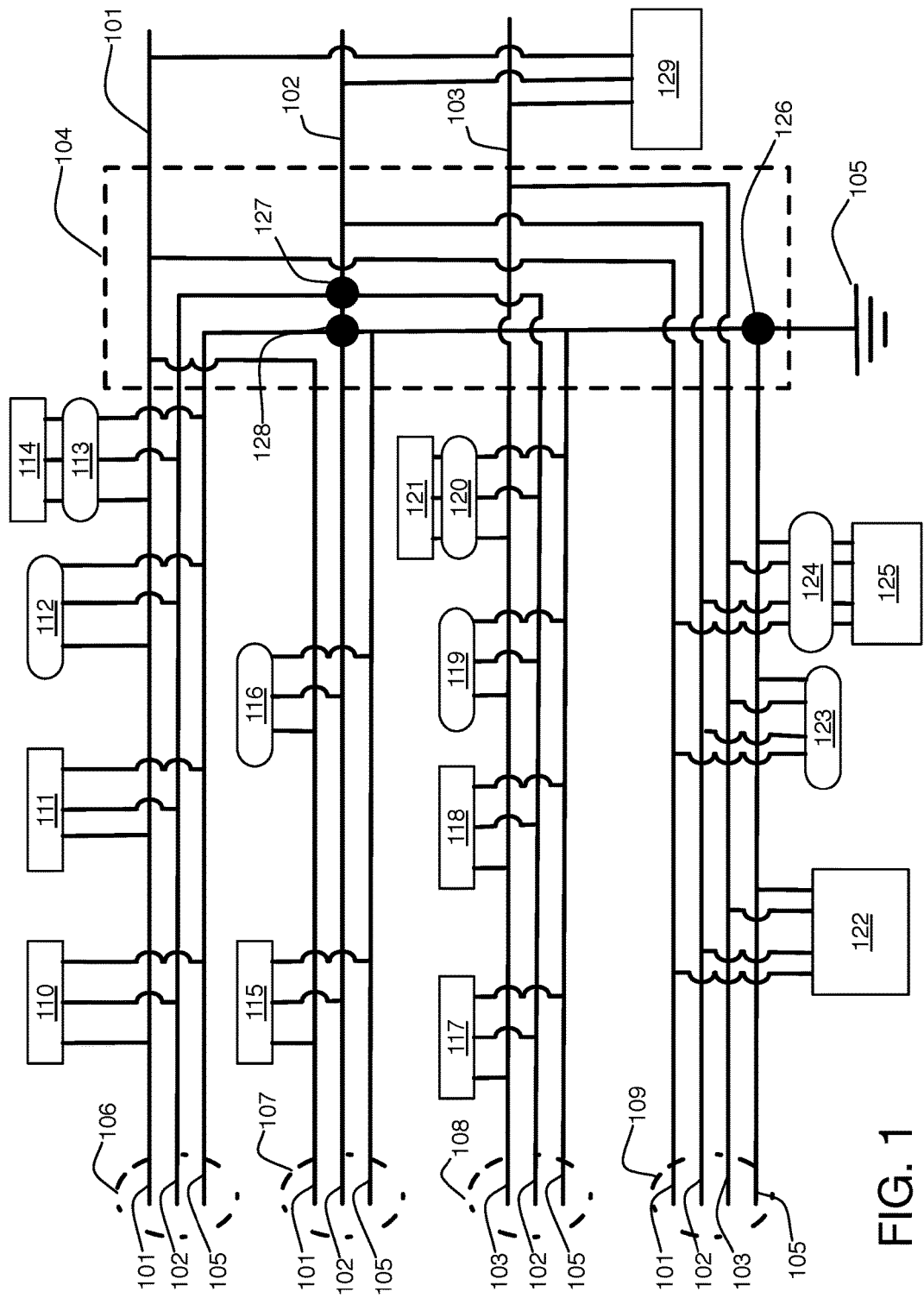
FIG. 1 schematically illustrates an exemplary residential electrical system with appliances to be monitored and monitoring units.

The example shown in FIG. 1 illustrates an exemplary split phase electrical system such as may be found in a common home in the United States. In this example, power is provided over three lines; a first hot line 101, a neutral line 102, and a second hot line 103. They are connected to the local house or office through a distribution box 104. Distribution boxes typically have breakers but they are not shown here. The distribution box is connected to the ground 105. A set of branch circuits may provide electrical power within the house, with at least one branch circuit for each phase of the electrical system. For example a first branch circuit 106 and another branch circuit 107 may correspond to a first phase and distribute power by extending the first hot line 101, the neutral line 102, and a ground line 105. A second branch circuit 108 may correspond to a second phase and distribute power by extending the second hot line 103, the ground line 105, and a neutral line 102. Another branch distributes higher-level voltage extending both the first hot line 101 and the second hot line 103, as well as the ground line 105 and the neutral line 102.

A multitude of electrical appliances may receive power from the electrical system. While described generically in the present example, electrical appliances may comprise any type of device that operates, either continuously or intermittently, using electrical power, such as refrigerators, vacuums, kitchen ranges, hair dryers, HVAC systems, etc. In the example of FIG. 1, appliance A 110 and appliance B 112 are connected through branch circuit 106 along with a monitoring unit 112, which may comprise a standalone Self-Installed Energy Monitor (SEM). Another monitoring unit 113 is connected to branch circuit 106 and permit electrical power to pass to appliance B 114. Appliance D 115 and an additional monitoring unit 116 may be connected into branch circuit 107. Communication between monitoring unit 112 and monitoring unit 113 may be referred to as L2L communication because they are on the same branch. Ground line 105 is used for safety only and is not used for power distribution; however, it is used by the monitoring units to provide a voltage reference from the power distribution point.

Many form factors are possible such as standalone monitoring units, integrated monitoring units, distributed monitoring units that allocate various functions between multiple monitoring units or with other devices, and monitoring units that permit power to pass through to an attached electrical appliance.

Still referring to FIG. 1, appliance E 117, appliance F 118, monitoring unit D 119, and monitoring unit E 120 are connected to second branch line 108 corresponding to a second phase of the split phase alternating current electrical system. Appliance G 121 is plugged into monitoring unit E 120. Communication between monitoring unit E 120 and monitoring D 119 is also L2L communication. Communication between monitoring unit B 113 and monitoring unit D 119 is dubbed L2N because they are on different branch circuits. Appliance 122 and monitoring unit F 123 and monitoring unit G 124 are connected to the high voltage branch circuit 109, monitoring unit G 124 providing power to appliance 125. In typical operation in the United States, the alternating current electrical system shown in the example of FIG. 1 would provide 120 volt electrical power on first phase of the system with branch circuits 106, 107 and on the second phase of the system with branch circuit 108, and would provide 240 volt electrical power on the high voltage branch circuit 109. Inside of breaker box 104, the appropriate connections may be made between lines coming from meter 129.

In operation, a monitoring unit engaged with an outlet may be calibrated by applying a known electrical load at the outlet and measuring the change in voltage between the hot line in the neutral line in between the neutral line and the ground line as a result of the application of that load. Meanwhile, one or more additional monitoring units engaged either on the same phase or a different phase of the electrical system may measure the change in voltage resulting from the application of the calibration load having known electrical properties at the first monitoring unit. After the calibration load has ceased to be applied at the first monitoring unit, a calibration load having known electrical properties may be applied at a second monitoring unit on a different phase of the electrical system. The second monitoring unit, the first monitoring unit, and any additional monitoring units may measure voltage change as a result of the application of the calibration load having known electrical properties at the second monitoring unit. Monitoring units beyond the first monitoring unit and the second monitoring unit may likewise sequentially apply a calibration load having known electrical properties while that monitoring unit and the other monitoring units engaged with outlets elsewhere in the electrical system measure and record the resulting change in voltage between the hot line and the neutral line and between the neutral line in the ground line.

In some embodiments, a calibration load may be separate from any monitoring unit. Moreover, the calibration loads provided, whether within a monitoring unit or separately, do not have to be identical. Further, a monitoring unit or other device coupling a calibration load to an electrical system may have more than one calibration load. Further, even if all calibration loads are provided with a monitoring unit, some monitoring units either may lack a calibration load or not apply the calibration load for some operations. Also, while the above example describes the sequential application of calibration loads, the coordinated simultaneous or partially simultaneous application of calibration loads may be implemented without departing from the scope of the present invention.

A processing unit, which may be located at one or more of the monitoring units or on a separate computing device, may use the measured changes in voltage by the various monitoring units during the application of the various calibration loads having known electrical properties to identify electrical properties of the electrical system to which the monitoring units are engaged. For example, by comparing the voltage drop between the neutral line and the ground line and the voltage drop between the hot line into the neutral line on different phases of the electrical system when calibration loads are applied to only one of the phases of the electrical system, the voltage drop due to the resistance in the electrical wiring, particularly between a transformer and the breaker box of the house (or business) or other structure can be determined. This calibration permits a more accurate determination of the power consumed by appliances operating on the electrical system.

During the monitoring operation of monitoring units, the calibration load having known electrical properties of each of the individual monitoring units will not be applied. During monitoring use, each monitoring unit may detect changes in voltage between the hot and neutral lines and between the neutral and ground lines of the outlet with which each monitoring unit is engaged. A processing unit may then take a combination of the measured voltage drops to determine properties, such as the identity of the electrical appliance causing the voltage change and the power consumed by electrical appliance responsible for the detected voltage change. As noted above, a measured voltage or a measured voltage change used for calibration and/or monitoring in accordance with the present invention may comprise an individual discrete measurement or a combination of measurements.

Figure 2:
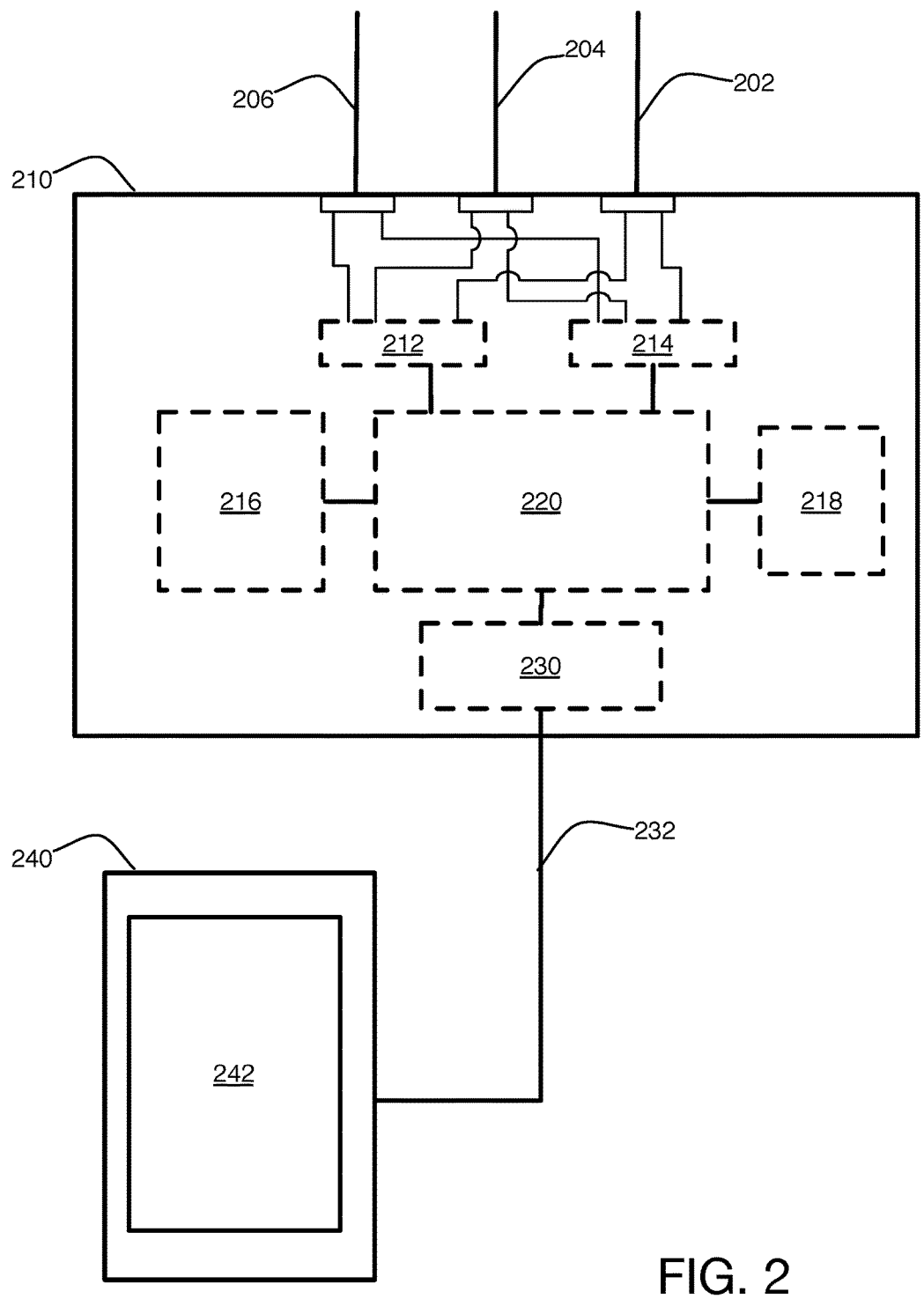
FIG. 2 schematically illustrates one example of a monitoring unit and a computing device.

Referring now to FIG. 2, one example of a SEM monitoring unit in accordance with the present invention that may be used to engage with outlet of an electrical system is illustrated. The example of FIG. 2 is exemplary only, and illustrates a particular example of a monitoring unit 210 that contains within the unit a large number of functional elements used in implementing the present invention. As explained further below, the functional elements used to implement the invention may be distributed over multiple monitoring units and may further be distributed over or entirely performed by computing devices operating separately and often remotely from a monitoring device.

As shown in FIG. 2, a monitoring unit 210 has been engaged with outlet of an electrical system. The outlet provides a hot line 202 that carries an electrical current, a neutral line 204, and a ground line 206. A voltmeter or other voltage-measuring unit 212 may interface with the hot line 202, the neutral line 204, and the ground line 206 in order to measure the voltage between pairs of lines. In particular, the voltage-measuring unit 212 may measure the voltage between the hot line 202 and the neutral line 204 and between the neutral line 204 and the ground line 206. The voltage-measuring unit 212 may be particularly configured to detect changes in the voltage between pairs of lines. In this fashion, an event detection approach may be useful so that monitoring unit 210 only records changes in voltage (whether a single measurement or multiple measurements that are combined) that are indicative of appliances or other loads being applied to the electrical system, rather than recording a number of measurements in which the voltage between lines is not changing because the applied load is not changing.

The monitoring unit 210 may also have a calibration load 214 having known electrical properties that may be applied to the hot lines 202 and neutral line 204 of the outlet. The calibration load 214 may be a current source load, a voltage source load, a power source load, a resistive load, a reactive load, or a combination. The calibration load 214 may be constant or may be variable. If variable, calibration load 214 may, for example, vary in time in a regular fashion or in an irregular fashion under the control of a processing unit. The application of the calibration load 214 may be coordinated with the voltage-measuring unit 212 of the monitoring unit 210 for calibration, or the voltage-measuring unit 212 may respond to the change in voltage caused by the application of the calibration load 214 as an event that is detected when the voltage changes between the hot line 202 and neutral line 204 and/or between the neutral line 204 and ground line 206 of the outlet.

While the example of FIG. 2 illustrates only a single monitoring unit 210, in accordance with the present invention the monitoring unit 210 may be used in combination with at least a second monitoring unit, such as the multiple monitoring units illustrated in FIG. 1, such that the additional monitoring units may detect a voltage change due to the application of calibration load 214, while voltage monitoring unit 212 of monitoring unit 210 may detect the voltage change due to the application of a calibration load at another monitoring unit.

A digital storage media 216 may be used to retain information sufficient to describe the voltages and/or voltage changes detected by the voltage-measuring unit 212. Digital storage medium 216 may comprise any type of volatile or nonvolatile machine-readable media. A monitoring unit 210 may also provide a database or knowledgebase 218 retained within a separate digital storage media or within the same digital storage medium 216 used to retain information describing the detected voltages. A database 218 may provide information useful in the identification of the voltage or power signatures of appliances operating on the electrical system, information describing the voltage or power signatures expected or anticipated fault conditions, machine learning algorithms, heuristics, and other instructions for the operation of systems and methods in accordance with the present invention. A database may be, without limitation, hierarchical, relational, object-oriented, and post-relational.

A processing unit 220 may coordinate the application of calibration load 214 and the receipt and storage of measurements by voltage-measuring unit 212 and the retention of information describing the voltages and/or changes in voltages within the digital storage medium 216. Processing unit 220 may further coordinate the application of calibration loads and/or the coordination of data collection with other devices, such as other monitoring units engaged with other outlets on the electrical system, for example on other branch circuits. Processing unit 220 may coordinate and communicate with other monitoring units (optionally having their own processing units) and/or other devices through a communication interface 230.

Communication interface 230 may operate via any protocol, such as various 802.11 protocols, Wi-Fi protocols, Bluetooth protocols, Zigbee, Zigwave or other wireless, optical, acoustic or wired protocols. One example of a device that may be communicated with via communication interface 230 by processor is a computing device 240 that may be used by a user to receive information regarding the power consumption and behavior of electrical appliances receiving power from the electrical system based upon measurements by the monitoring unit, as well as to input information regarding the electrical system and/or the appliances operating on the electrical system for use in calibration and other tasks, as well as to potentially control the operation of monitoring unit(s). Examples of computing devices 240 that may be used in accordance with the present invention are smart phones, tablet computers, personal computers, cable boxes, routers, gateways, and any other type of computing device. In the particular example illustrated in FIG. 2, computing device provides a display 242 that may be used to output information to a user in a form that may be perceived by the user. For example, display 242 of computing device 240 may output information describing power consumption by appliances operating on the electrical system, potential fault conditions, etc. Further, computing device 240 may be only one of several computing devices that exchange information with one or more monitoring unit via a communication interface(s). Various computing devices that are used in conjunction with systems and methods of the present invention may have different types of output and different types of input available to them for the user. In some instances, some or all alerts regarding potential default or failure conditions detected in appliances, or even within the electrical system itself, may be provided with auditory and/or visual outputs.

Figure 3:
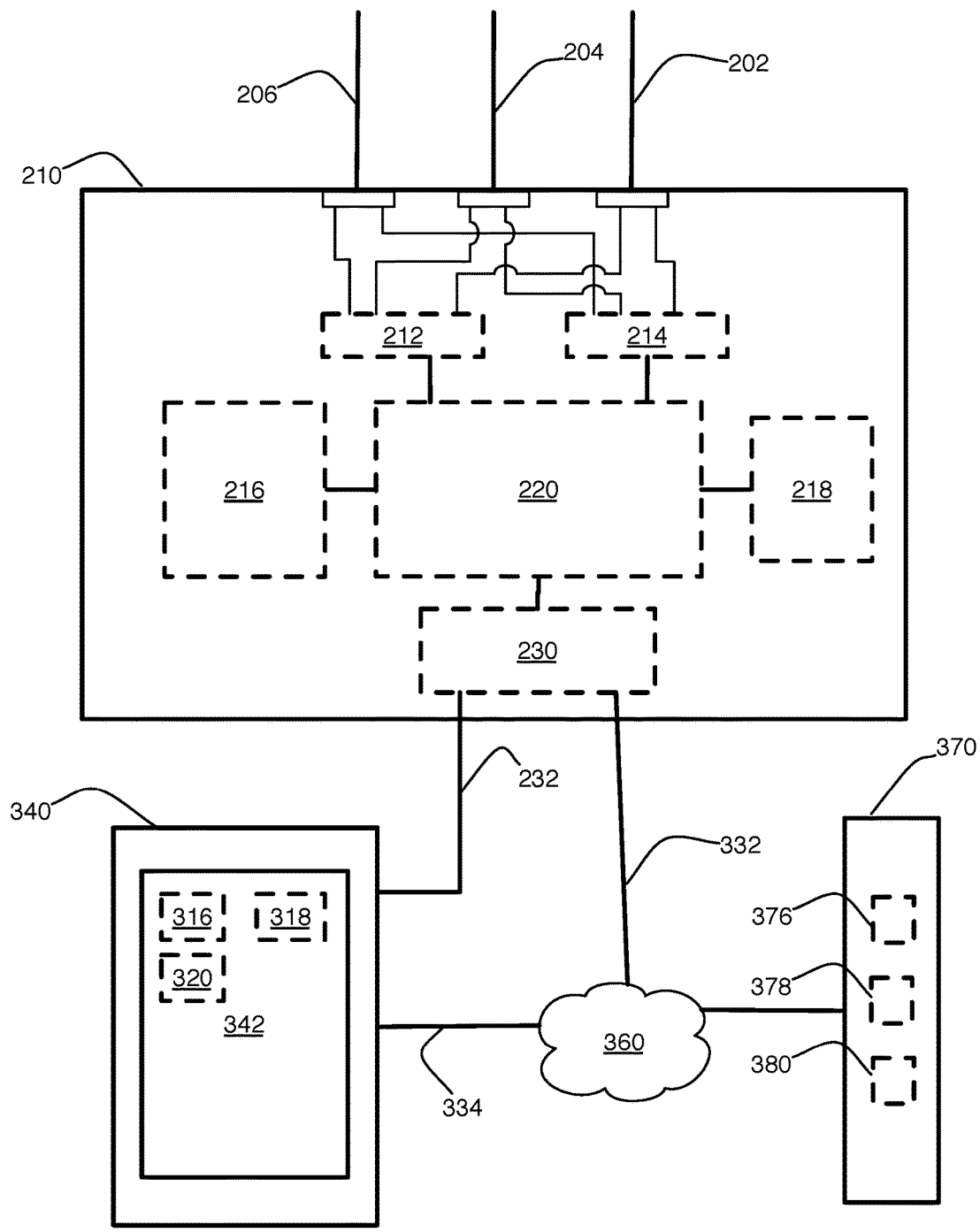
FIG. 3 schematically illustrates one example of a monitoring unit and a computing device in communication with a remote server.

FIG. 3 illustrates a further example of a system in accordance with the present invention. In the example of FIG. 3, a monitoring unit 210 such as described above with regard to FIG. 2 is provided. In addition to the monitoring unit 210, a computing device 340 may provide additional digital storage medium 316, either as an augment to the digital storage medium 216 on the monitoring unit 210 or as a secondary repository of stored data. In some examples, only a most recent portion of data collected at the monitoring unit 210 may be retained within the digital storage medium 216 on the monitoring unit 210, with recorded data being periodically transferred from the digital storage medium 216 of the monitoring unit 210 to the digital storage medium 316 of computing device 340. Such a transfer may occur on a scheduled basis, on an asynchronous basis, on an occasional basis as information is available for transfer from the monitoring unit 210 and the computing device 340 is available to receive the transfer, as the digital storage medium 216 on the monitoring device 210 becomes substantially filled with data, schemas, and/or instructions.

Still referring to FIG. 3, computing device may also provide a database 318 that may be used to replace, supplement or augment the database 218 of the monitoring 210 described above. The database 318 on the computing device 340 may, for example, completely replace a possible database 218 on a monitoring unit 210, or may be more extensive than a database 218 on monitoring unit 210 in terms of the detail and amount of information provided therein. It may provide for the extraction, transfer and loading of key records, tables, graphs, and/or other structures. Further, a computing device 340 may contain an additional database or databases beyond a single database 318. Further, the computing device 340 may provide a processing unit 320 that performs some or all of the operations described with regard to a processing unit 220 operating on a monitoring unit 210. For example all or part of controlling the operation of the voltage-measuring unit 212, the calibration load 214, and/or any other components contained within monitoring unit 210 or other monitoring units may be controlled by the processing unit 320 of computing device 340 through the communication interface 230 of the monitoring unit 210. A processing unit (whether operating on a computing device or on a monitoring device, and whether operating alone or in combination with other processing units) may comprise any type of computer processor executing computer readable code to perform the operations described for systems and methods in accordance with the present invention.

Still referring to FIG. 3, a remote server 370 may be accessed over a network 360, such as the Internet, an intranet or a Virtual Private Network. Remote server 370 may also provide functionality such as digital storage media 376, a processing unit 380, and/or one or more database 378. In actual operation, some or all of one or more of the individual types of functionality described herein may be provided at one or more of a monitoring unit, a computing device accessible via a communication, and/or a remote server accessible via a network. A remote server may be dedicated or shared, real or virtual.

Figure 4:
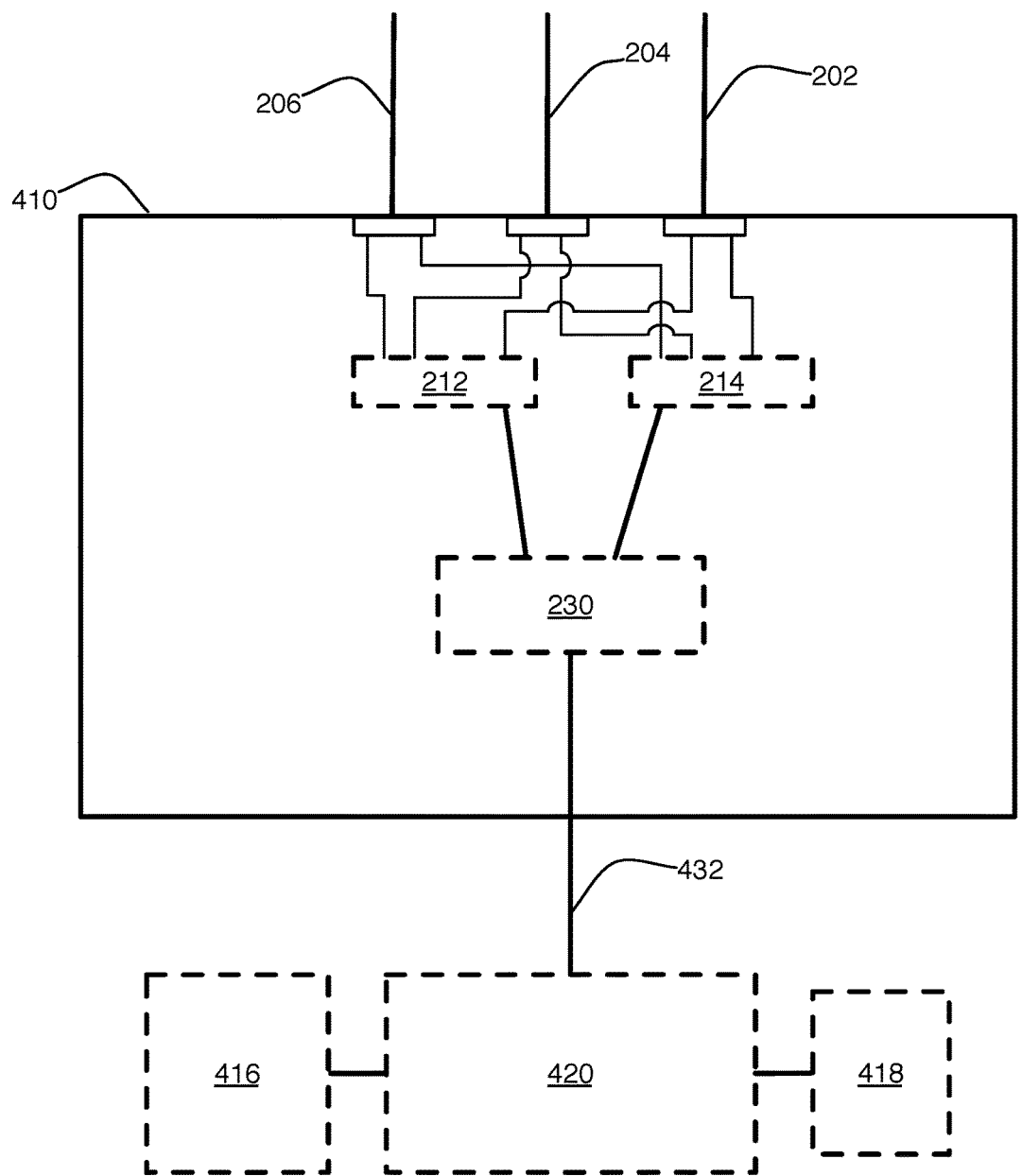
FIG. 4 schematically illustrates one example of a monitoring unit with distributed functionality.

Referring now to FIG. 4, further example of possible arrangements of various components for use in systems and methods in accordance with the present invention is illustrated. In the example of FIG. 4, a monitoring unit 410 may provide a voltage-measuring unit 212, a calibration load 214 having known electric properties, and a communication interface 230. Optionally external to the monitoring unit 410, a processing unit 420 may control the operation of the voltage-measuring unit 212 and the calibration load 214 within the monitoring unit 410. Processing unit 420 may access a digital storage medium 416 and/or a database 418 as part of the operation of systems and methods in accordance with the present invention. Digital storage medium 416, the processing unit 420, the database 418, and/or any further elements desired in accordance the present invention may be located at various devices other than the monitoring unit 410 illustrated in FIG. 4. For example, digital storage medium 416, processing unit 420, and database 418 may be located at different monitoring unit than the monitoring unit 410 illustrated in FIG. 4. For example, in some configurations, a system in accordance with the present invention may comprise a master monitoring unit that controls the operation of other monitoring units, such that the master monitoring unit provides all were most of the control from a processing unit, all or most of the digital storage in the digital storage medium, and all or most of information regarding voltage or power signatures in a database. Additionally/alternatively, elements such as a processing unit, digital storage medium, and a database may be provided on a computing unit discrete from the monitoring unit, on a remote server, or elsewhere.

Figure 5:
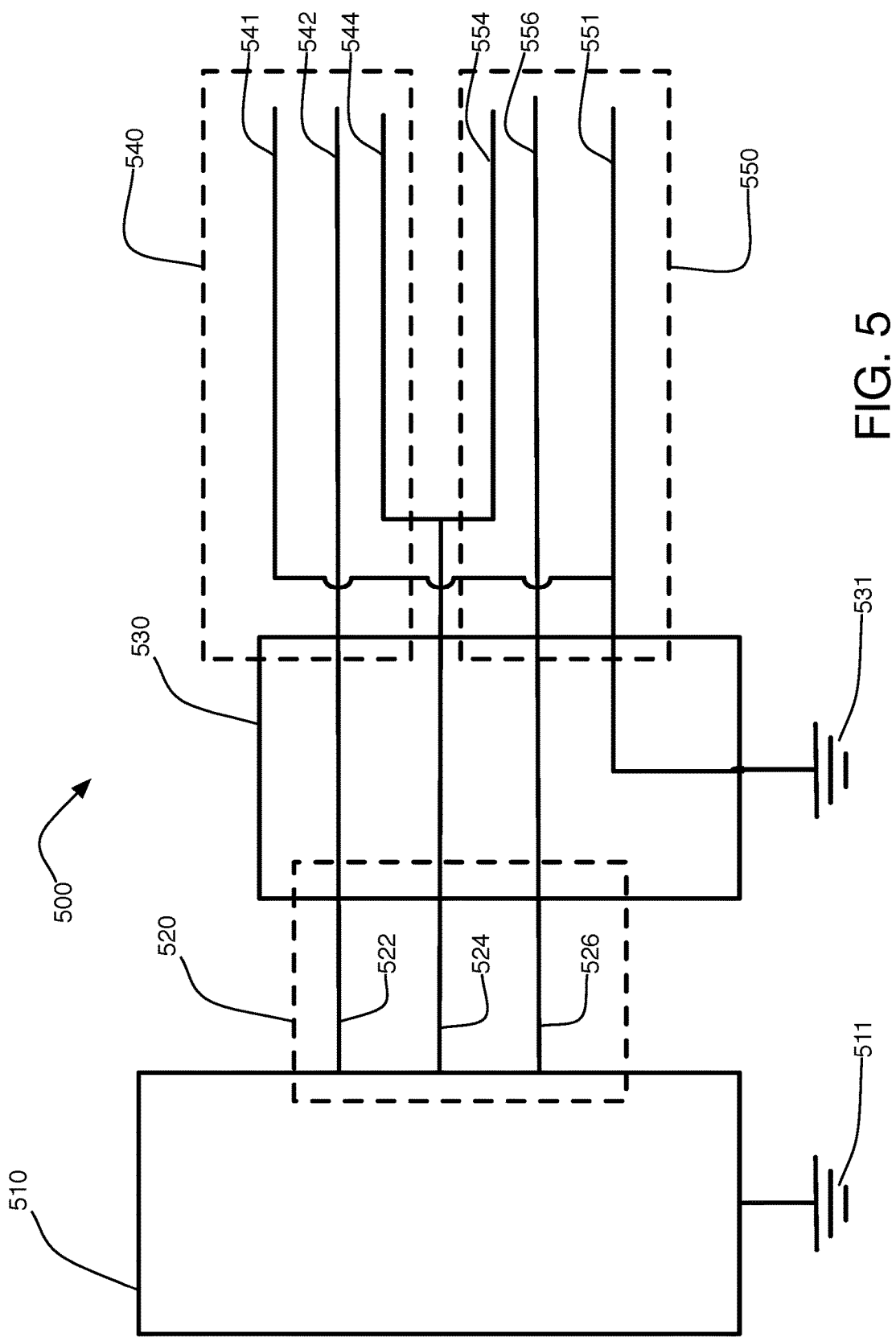
FIG. 5 schematically illustrates branch circuits of a dual phase alternating current electrical system that may deliver electrical power to appliances monitored using systems and methods in accordance with the present invention.

Referring now to FIG. 5, a simplified schematic diagram of an electrical system 500 in accordance with the present invention is illustrated to further describe the calibration of monitoring units in accordance with the present invention. As is typical in a split phase electrical system (and is typical in residential electrical systems in the United States), and in the particular example of FIG. 5, in an alternating current electrical system 500 a transformer 510 may provide electrical power to a home (or other structure or unit) via a breaker box 530 or fuse box. Electric power may be provided from the transformer 510 via a first line 522, a second line 526, and a neutral line 524. The transformer 520 may typically be grounded 511. Further, the breaker box 530 or fuse box may also be grounded 531. In the simplified illustration of FIG. 5, the first line 522 is used as the hot line 542 of a first phase 540 of the residential electrical system, while the neutral line 524 provides the neutral line 544 of a first phase 540 of the residential electrical system. Meanwhile, a ground line 544 may also provided for the first phase 540 of the residential electrical system. Meanwhile, a second phase 550 of the residential electrical system is formed using the second line 526 from the transformer 510 as the hot line 556, the neutral line 524 from the transformer 510 as the neutral line 554 of the second phase 550 of the residential electrical system, and a ground line 551 from the breaker box 530. Due to the resistance of wires (and any other components) a voltage drop of some amount will occur between the transformer 510 and the breaker box 530 in section 520 of the electrical system 500. In order to isolate a voltage drop occurring on either the first phase 540 or the second phase 550 of the residential electrical system, such as caused by the application of a load by an operating electrical appliance, the voltage drop in section 520 must be excluded from the change in voltage observed by a monitoring unit deployed on that phase of the residential electrical system. By comparing the voltage measurements during the application of a calibration load on the first phase 540 of the residential electrical system at both an outlet of the first phase 540 and an outlet of the second phase 550 of the residential electrical system, and then performing similar voltage measurements while a calibration load is applied to the second phase550 of the residential electrical system, the voltage drop occurring in section 520 between the transformer 510 and the breaker box 530 may be isolated from any voltage changes occurring due to appliances operating on one (or both) of the either the first phase 540 and the second phase 550 of the residential electrical system. Accordingly, by estimating and/or excluding power loss occurring due to the resistance of the wiring and other elements of the electrical system itself, a more precise identification and quantification of the power consumed by electrical appliances operating on one of the phases of the electrical system may be obtained in accordance with the present invention. While FIG. 5 illustrates a simplified example with only two branch circuits (one branch circuit for the first phase 540 and one branch circuit for the second phase 550), and with no high voltage circuit illustrated, the principles described with regard to the simplified example of FIG. 5 may be applied to considerably more complicated electrical systems. Further, while FIG. 5 illustrates an example of a split phase alternating current system, systems and methods in accordance with the present invention may be used with other types of electrical systems, such as (for example) tri-phase electrical systems.

Figure 6:
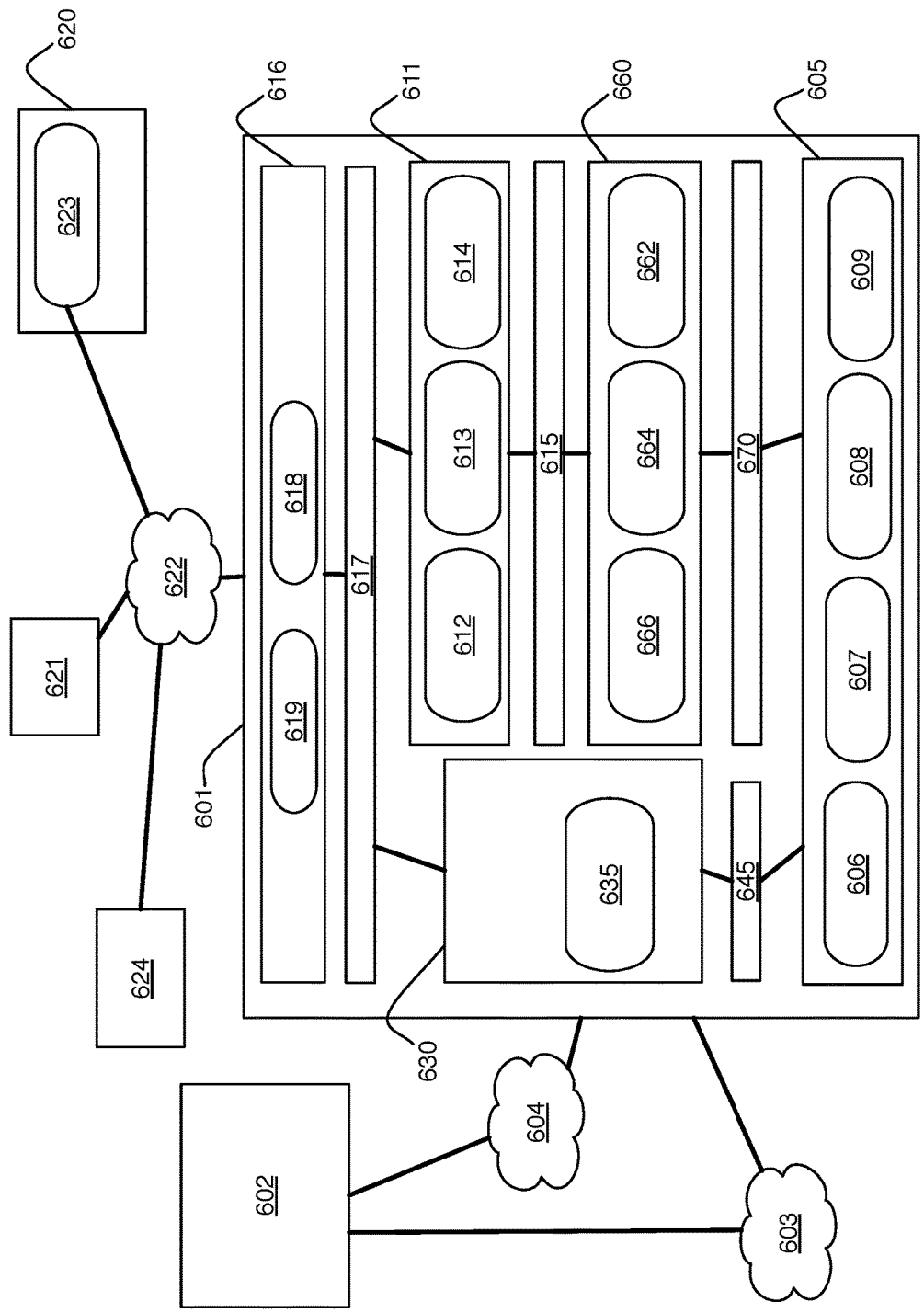
FIG. 6 schematically illustrates a monitoring unit block diagram suitable for connection between lines of an electrical outlet.

Referring now to FIG. 6, a further depiction of the various components used in processing data in accordance with the present invention is illustrated. In the example illustrated in FIG. 6, various blocks of functionality are depicted for the example when the functionality of the system in accordance with the present invention is contained within a monitoring unit, such as may be the case for examples such as that described with regard to FIG. 2 above. However, as also described above, the functionality may be split among numerous monitoring units, may be distributed between monitoring units, a computing device and/or a remote server, or maybe entirely located at a computing device or a remote server.

FIG. 6 shows a system and service architecture based on deploying monitoring units on an electrical system, including functional elements that may be located inside a monitoring unit or a computing device. It should be noted that these functional elements do not have to map to physical nor logical components. Further, these functional elements may be distributed between multiple devices or components of devices. In the example of FIG. 6, two monitoring units 601 and 602 are connected to a power grid 603. They communicate with each other through a local area network 604. The network 604 and power grid 603 may be supported by the same or different infrastructure. The monitoring unit 601 (as well as monitoring unit 602 or any additional monitoring units) may provide a series of processing items 605, such as a signal processing engine optimized for frequency domain processing 606, a signal processing engine optimized for amplitude domain processing 607, a block of hardware elements 608 and a block of software components 609. The processing items 605 may be used for a multitude of purposes, but allow the processing of algorithms in series or parallel in real or near real time. Processing items 605 may require a synchronization method to operate. Processing items 605 may interface with a classification/detection functional block 660 through an interface 670. The classification/detection block 660 may provide a device awareness subsystem 662 which is responsible to manage the identification of devices plugged in or pluggable on the power grid. This identification can be based on a combination of power, current, noise, voltage, harmonic, current, timing, synchronicity, phase, and/or impedance attributes. Those devices can vary from washing machines to microwave ovens to industrial motors to lighting systems and beyond. Because some devices (say vacuum cleaners) are not always plugged in to a grid, the set of devices tracked can be more extensive than what is installed in the house, business, plant where the system is deployed. A topology awareness block 664 deals with reflectrometry support, transmittometry support, management of the different branches of the network, multiple phases, and relationships between monitoring units, and between monitoring units and elements of the grid. The event awareness block 666 manages events such as turn on/off, changes of modes of operation, and/or devices plugged in/unplugged. The device awareness module 662 typically deals with background signals whereas the event awareness module 666 typically deals with transients. The classification/detection block 660 may interface with a (optional) compressive sensing block 611 which may extract the relevant qualitative and quantitative attributes. Compressive sensing block 611 may provide a data compression block 612, which may be multidimensional, whose purpose is to reduce storage and communication requirements for other functional elements, a data and attributes management block 613 which manages objects (basically a store manager), and a heuristic block 614 that captures object matter rules. Often the monitoring unit 601 is included in or includes additional functionality not related to power (for instance alarm or alert management), which may be supported by auxiliary block 635. The compressive sensing and non-monitoring unit block interface with the logic application processor 616 through an application processing interface 617. The application processor 616 may include non-volatile memory 618 and instruction code 619. The monitoring unit 601 (potentially as well as monitoring unit 602 and other monitoring units) is supported by one or more data analytics engines 620, 621 connected to the monitoring units using the Internet (or equivalently an intranet or VPN) 622. The monitoring unit 601 may be connected to the data analytics engines 620, 621 directly or through a relay like relay. A data analytics engine such as data analytics engine 620 may include one or more application programs 623. Service provider 624 may use the results from one or more analytics engines 620 and 621 to support consumer, commercial, and industrial services.

Changes in the voltage and changes in the shape of the voltage over short and long period of times are used as an indicator of load changes. Correlation noise measured on the line (attributes thereof) and voltage drop (change of shape) to ascertain if forcing is internal to site or external to site.

Any measurement system can benefit from filtering signals using linear and nonlinear filtering techniques.

Configuration information can be used to improve the estimate. They include, but not limited to: the distance of circuit breaker to transformer; the number of circuit groups to said transformer; wire sizes; circuit breaker amperages; number of plugs; multi-dwelling information; description of load devices and relevant attributes; description of expected devices being powered; description of monitoring units (including version); and/or outlets on the branch.

In a power grid with a battery-backed system, integration with battery switching or replacement battery is desirable.

Correlation, joint probability, Point Mutual Information (PMI), closeness, distance, and pseudo-distance measurements are used to determine power consumption changes as they corresponds to changes in observed voltages.

Voltage drop signatures may be provided in tables to aid in identification of specific equipment. The contents may be available as known instances from a general repository, or derived locally as they are associated automatically or with user assistance. The signatures can be one out of a series known for a particular device type. Series can be TOD (Time of Day), DOW (Day of the Week), WOY (Week of the Year) dependent, or any other suitable time frame. It can be stored locally or downloaded from a remote repository as needed.

Figure 7:
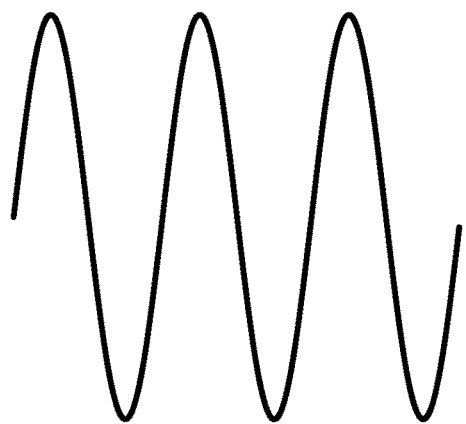
FIGS. 7-9 illustrate phases of alternating current electrical systems that may be used in the timing of making voltage measurements with a monitoring unit.

Referring now to FIG. 7, the electrical voltage provided by a single phase of an alternating current system with no load applied is illustrated. As can be seen in FIG. 7, voltage alternates in a sinusoidal fashion, typically with a frequency of 60 Hz in the United States. Only a single phase is shown in FIG. 7, as only a single phase may be present within a single phase of a split phase alternating current electrical system. One aspect of the present invention may be used to record voltage measurements using a clock or other unit within a monitoring unit to coordinate voltage measurements with the change in phase of the voltage of the alternating current electrical system. For example, measurements may be taken at the zero point, immediately before or after the zero point, or at peaks, etc. in order to provide different information regarding the electrical properties of the electrical system and/or appliances receiving power from the electrical system and the response of the system or appliances to different phases of an electrical signal.

Figure 8:
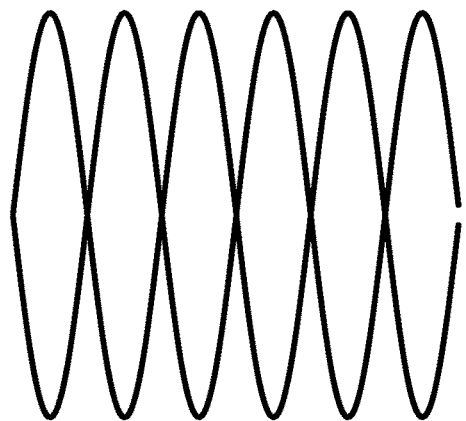

Referring now to FIG. 8, the combined voltages of two phases of a split phase electrical system are illustrated. The signals depicted in FIG. 8 may correspond, for example, to the electrical voltage delivered by a typical split phase alternating current system before each phase is divided into a different phase to deliver a single 120 V electrical supply, or that may be combined to provide a 240 V electrical supply. As described above with regard to FIG. 7, voltage measurements may be made at times selected based upon the phase of the signals illustrated in FIG. 8 to provide additional information regarding the response of an electrical system and/or electrical appliances operating on the electrical system.

Figure 9:
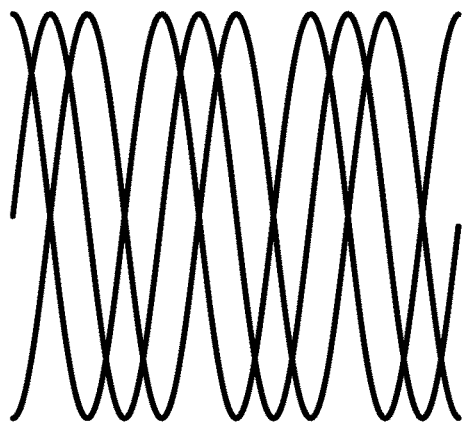

Referring now to FIG. 9, an example of a tri-phase system signal is illustrated, with three alternating voltages provided. As described above with regard to FIGS. 7 and 8, the individual signals may be divided into separate phases or combined into a single circuit. Measurements may be made in coordination with the phase of the signals of the tri-phase system in order to provide additional information regarding the electrical properties of the tri-phase electrical system and/or appliances receiving electrical power from the try phase electrical system.

Figure 10:
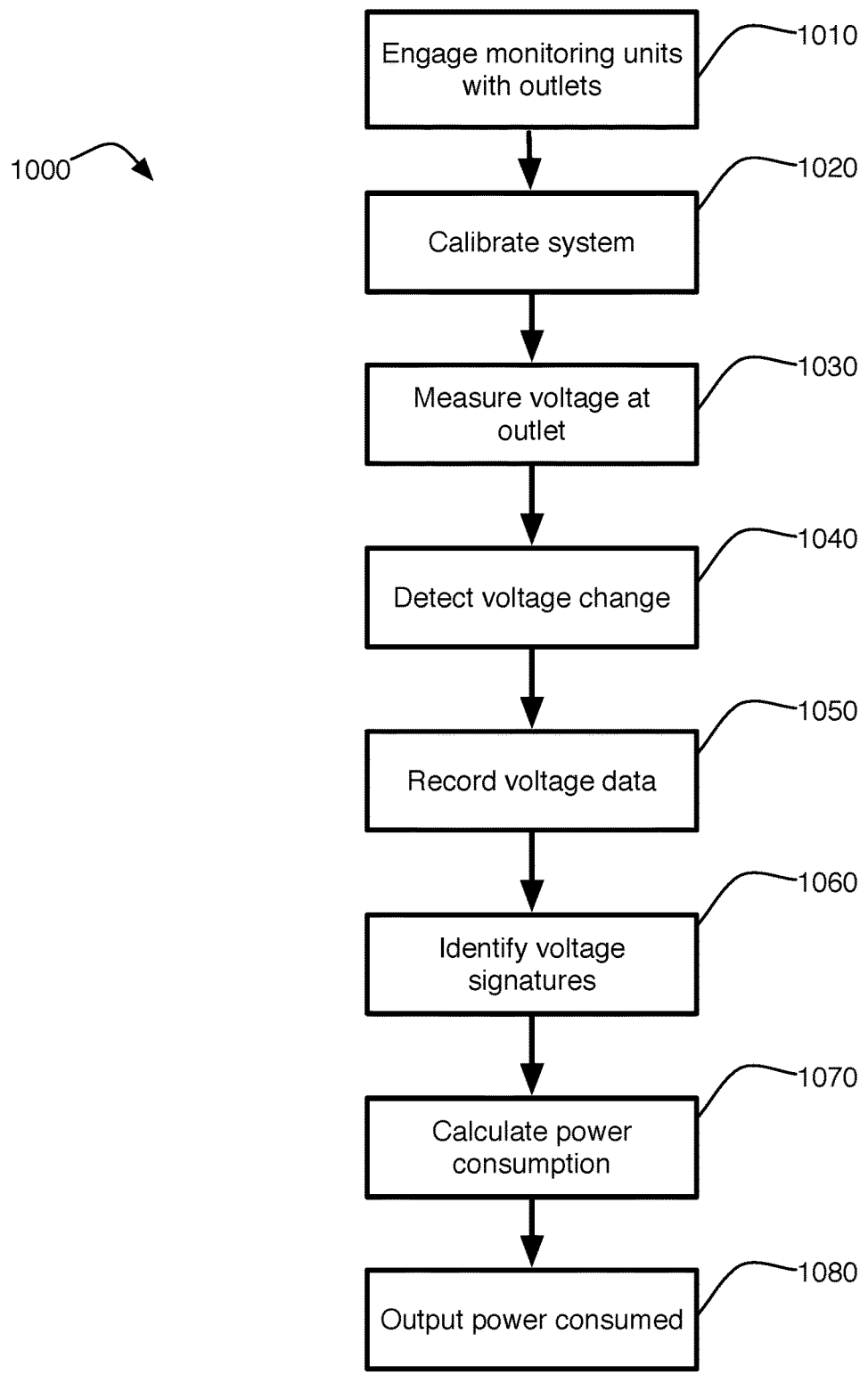
FIG. 10 illustrates a method for monitoring the power consumption of appliances receiving electrical power from an electrical system.

Referring now to FIG. 10, a method 1000 in accordance with the present invention is illustrated. The method illustrated in FIG. 10 is an example of one method in accordance with the present invention of monitoring the power consumption of electrical appliances operating on an electrical system. At least one monitoring unit may be engaged with at least one outlet on each phase of an electrical system in step 1010. More than one monitoring unit may be engaged in outlets on a given phase of an electrical system, and a single phase of an electrical system may have one or more branch circuit. After engaging the monitoring units with outlets on the alternating current electrical system, the monitoring units and/or the monitoring system may be calibrated, as shown in step 1020. Calibration may comprise applying a calibration load having known electrical properties to the electrical system, for example at a monitoring unit, and measuring the resulting changes in voltage between the hot and neutral lines and between the neutral and ground lines of the outlets engaged by each of the monitoring units. Measuring may comprise making a single discrete measurement or combining multiple measurements. The application of calibration loads and measuring of voltage changes may then be repeated for at least one monitoring unit on each of the phases of the alternating current electrical system. Calibrating the system may further comprise receiving information describing the topology of the electrical system and/or the nature of some or all appliances receiving electrical power from the alternating current electrical system. For example, a computing device may provide input devices that receive information from a user describing the topology and/or appliances anticipated to be operating on the electrical system.

Method 1000 may further comprise measuring the voltage between a hot and neutral line and between a neutral and ground line at each of the outlets engaged by a monitoring unit in step 1030. Measuring may comprise making a single discrete measurement or combining multiple measurements. The monitoring unit may detect a voltage change between the lines of an outlet in step 1040. The measuring 1030 of voltage and detecting changes 1040 in voltage may occur when no calibration load is being applied in the calibration process of step 1020. While the measuring 1030 of voltage and detection 1040 of voltage changes may be expected to occur after the calibration of step 1020, calibration step 1020 may occur after some or all measurement of voltages and detection of voltage changes has occurred.

Method 1000 may further involve a recording step 1050 to record information describing the voltage measurements and/or voltage changes detected by monitoring units. The data recorded may be used in an identification step 1060 to identify voltage or power signatures of one or more appliances operating by receiving power from the electrical system and causing observed changes in voltage. The identification of voltage or power signatures may be performed using various mathematical algorithms and/or through comparison to anticipated voltage or power signatures from one or more databases.

The power consumed by one or more appliances may be calculated in step 1070. In some examples, the power consumed may be allocated on an appliance-by-appliance basis by matching power consumption to the identified voltage or power signatures of the operating appliances. The calculated power consumed may be output 1080 using an output device, such as the screen of a computing device.

Figure 11:
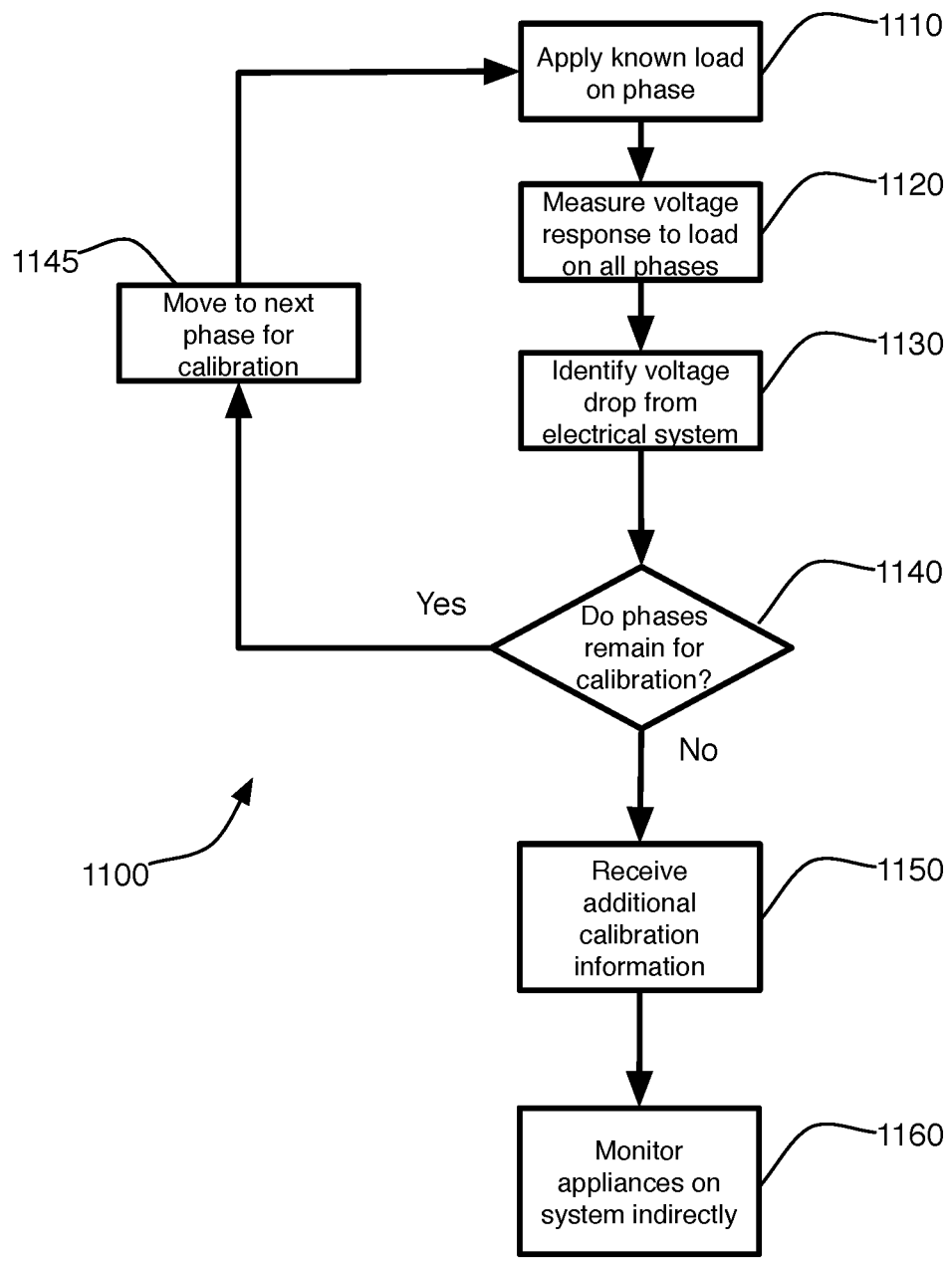
FIG. 11 illustrates a method for monitoring the operation of appliances receiving electrical power from an electrical system.

Referring now to FIG. 11, a further example of a method 1100 for monitoring the operation of appliances receiving power from an electrical system is illustrated. Method 1100 may begin by applying a known calibration load to a branch circuit corresponding to one phase of the electrical system in step 1110. The application of a calibration load may occur, for example, within a monitoring unit such as described above. When the known calibration load is applied, the resulting voltage response may be measured on other branches circuits at step 1120, for example by monitoring units engaged one at least one output of each phase of the electrical system. After a calibration load has been applied in step 1120 and the resulting voltage response has been measured in step 1130, a determination may be made at step 1140 as to whether additional phase of the electrical system remain for calibration. If additional phases of the electrical system remain for calibration, step 1145 may return the method 1100 to step 1110 for calibration at a branch circuit on the next phase of the electrical system. Once no phases of the electrical system remain in the calibration process, step 1140 of method 1100 may proceed to step 1150. If desired, additional calibration information, such as provided by a user via an input device at a computing device maybe received in step 1150. The receipt of additional calibration information in step 1150 may occur before, after, or during steps 1110, 1120, 1130, and/or 1140. Additional calibration information may comprise, for example, information identifying which appliances are operational on the electrical system, any known attributes of those appliances, and even, if known, which appliances are on which branch circuit or phase of the electrical system. With this calibration information provided, the monitoring units may indirectly monitor appliances that receive electrical power from the electrical system in step 1160 by detecting and recording further changes in voltage at a monitoring unit. Voltage changes recorded may comprise individual discrete measurements or combinations of measurements.

In addition to providing information with regard to the power consumed by appliances operating on an electrical system in accordance with the present invention, systems and methods in accordance with the present invention may provide information regarding possible fault conditions of appliances operating on an electrical system. An identified fault situation may result in issuing an alert via a computing device or another output device to advise a user that an appliance or even the electrical system itself may require some manner of servicing.

Figure 12:
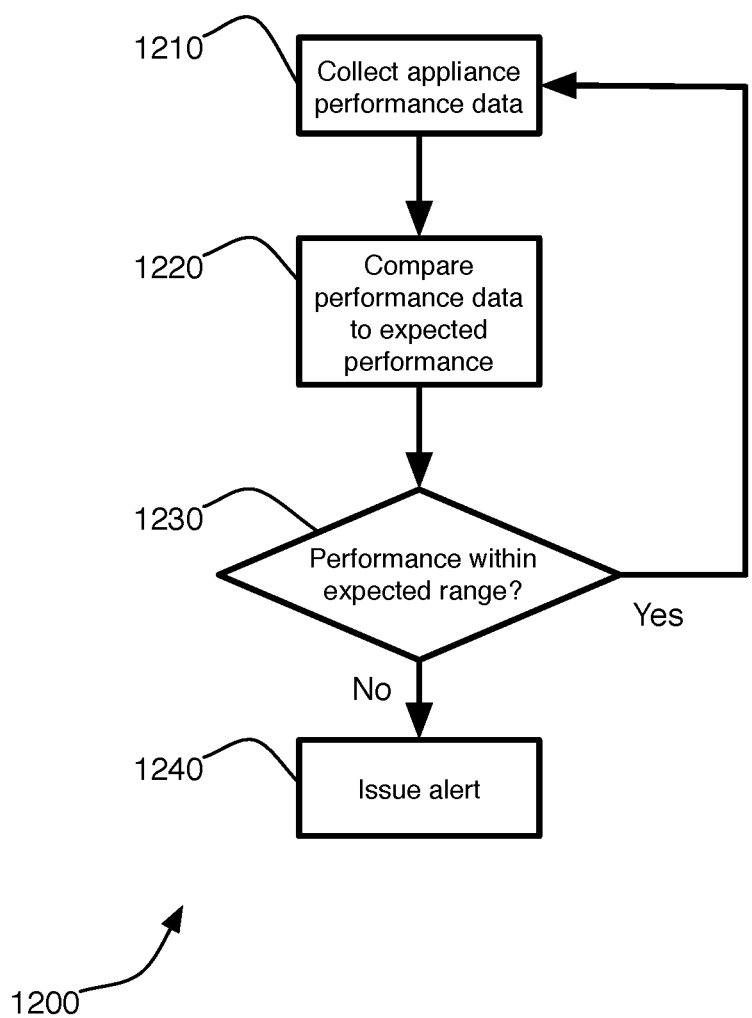
FIG. 12 illustrates a method for detecting potential fault conditions in appliances receiving power from an electrical system.

FIG. 12 illustrates an exemplary method for detecting possible fault, out of normal or out of specification conditions in an appliance or an electrical system and issuing an appropriate alert. Various monitoring units may have already been engaged with appropriate outlets of an electrical system and calibrated, such as described herein. Appliance performance data may be collected, for example by detecting changes in voltage associated with the operation of electrical appliances receiving power from the electrical system. Various voltage or power signatures may be identified that correspond with individual appliances in operation on the electrical system. Those electrical signals may be determined based upon calculations performed upon collected voltage or power data and/or by comparing collected voltage data or power data to anticipated voltage or power signatures of particular types of appliances. For example, anticipated voltage or power signatures for appliances such as refrigerators, furnaces, ovens, tops, hot water heaters, and the like may be provided within a database that may be retained on a monitoring unit, on a computing device, on a remote server, or elsewhere. Once the individual voltage or power signatures in particular appliances have been identified, the performance of each individual clients and data describing the performance of that individual appliance may be collected by monitoring units in accordance with the present invention. Any type of electrical appliance may be monitored in accordance with the present invention. Examples of types of electrical appliances that may be monitored in accordance with the present invention include, but are not limited to, HVAC systems or components, furnaces, water heaters, clothes dryers, cooking ranges, dishwashers, jacuzzis, microwave ovens, washing machines, toasters, solar panels, solar panel inverters, electric car chargers, other chargers, blow dryers, televisions, computers, monitors, refrigerators, freezers, garage door openers, thermostats, lighting systems or elements of lighting systems, pool pumps, and other pumps. Any type of fault or possible fault (or other performance condition) may be detected in accordance with the present invention. Examples of fault conditions that may be detected in accordance with the present invention include, but are not limited to, a temperature level in a refrigerator, frost in a freezer, an open door, an ice maker not working, a fan blocked, a fan broken, a heating element not functional, a pump not functional, a clogged pipe, an impeded airflow, an impeded water flow, a filter due for replacement, a high pressure switch set, a wiring mistake, a low coolant level, a leak, a blocked duct, a frozen coil, a diode failure, a capacitor failure, a door switch status, a magnetron failure, a transformer burned out, and a thermal fuse blown.

The collected performance data of an appliance may be compared to expected performance data of the appliance in step 1220. The expected performance data of an appliance may be derived in a variety of fashions. In one example, historical information regarding the operation of an appliance may be used. For example, a particular appliance, such as a refrigerator, may function in a particular fashion over a long period of time and therefore provide an expected voltage or power signature for that appliance. However, the voltage or power signature of that appliance may change slowly or rapidly, or may alternatively become more or less active, in a fashion that may be indicative of a problem or fault with that appliance. Alternatively/additionally, expected performance information may be provided in a database for comparison to collected data for that appliance or type of appliance. Further, anticipated or common voltage or power signatures of fault conditions in one or more appliance may be provided in such a database as well. Such information may be used by method to determine whether the performance of an individual appliances within an expected range. This comparison might take into account ancillary information, such as internal temperatures, external temperatures, and/or the presence of individuals inside of the monitored house.

Step 1230 may determine whether the collected performance data for an appliance is within the expected range. If the performance of an appliance is within the expected range for that appliance, method 1200 may simply continue to monitor the performance of the appliance by returning to step 1210. If, however, the performance of an appliance is not within an expected range, an alert of some form may be issued in step 1240. Different types of fault conditions may result in the issuance of different types of alerts. For example, an alert of a type that may pose a risk of electrical fire may involve activating all available output devices to advise a user of the potential danger. On the other hand, a fault condition corresponding to the possible need for future servicing of an appliance may result in the issuance of an alert that comprises a badge or icon associated with the particular appliance as part of a report of the power consumption of the appliances receiving power from the electrical system.

An integral component of the issuance of an alert regarding a possible fault condition may be an invitation or opportunity to engage in a transaction or other activity related to that fault condition. For example, a fault condition in a malfunctioning appliance may result in the issuance of an alert and the provision of contact information for a repair service that may either repair the appliance or the evaluate the appliance and advise the user as to the need of replacing the potentially malfunctioning appliance. Any type of transaction or activity may be proposed or offered, whether commercial or non-commercial in nature. Examples of transactions or other activities that may be proposed or offered include, but are not limited to, maters related to advertising, lead generation, affiliate sale, classifieds, featured list, location-based offers, sponsorships, targeted offers, commerce, retailing, marketplace, crowd sourced marketplace, excess capacity markets, vertically integrated commerce, aggregator, flash sales, group buying, digital goods, sales goods, training, commission, commission per order, auction, reverse auction, opaque inventory, barter for services, pre-payment, subscription, software as a service (saas), service as a service, content as a service, infrastructure/platform as a service, brokering, donations, sampling, membership services, support and maintenance, paywall, insurance, peer-to-peer service, transaction processing, merchant acquiring, intermediary, acquiring processing, bank transfer, bank depository offering, interchange fee per transaction, fulfillment, licensing, data, user data, user evaluations, business data, user intelligence, search data, real consumer intent data, benchmarking services, market research, push services, link to an app store, coupons, digital-to-physical, subscription, online education, crowd sourcing education, delivery, gift recommendation, coupons, loyalty program, alerts, reduction in insurance premium, and coaching.

While systems and methods in accordance with the present invention have been described with regard to particular examples, the examples provided herein are for illustrative purposes only, and are not limiting. Various deviations may be made from the examples described herein without departing from the scope of the present invention. For example, more or fewer monitoring units may be used in accordance with the present invention than described in the various examples herein. Further, the composition of various monitoring units may vary considerably from that described herein. The functionality of processing units, storage media, databases, the content of databases, the particular nature of data stored to describe voltage measurements and/or changes in measured voltages, may vary.

Systems and methods in accordance with the present invention are not limited to any particular type of electrical system, are not limited to monitoring the power consumption and/or performance of any particular type of electrical appliances, and may be used in conjunction with any of a variety of computing devices, output devices, and other items. Systems and methods in accordance with the present invention may, for example, be periodically updated via software update processes over networks such as the Internet. For example, databases describing anticipated voltage or power signatures of electrical appliances and/or voltage or power signatures associated with various fault conditions may be updated from a remote server as new electrical appliances and their voltage or power signatures are available and as new fault conditions and the voltage or power signatures become available or known.

The communication of information between various components as described herein is not limited to any particular protocol. Communication may be exchanged in synchronous or asynchronous fashion between various components of the present invention, may be exchanged via wired or wireless communication media.

The various methods and systems in accordance with the present invention may operate using computer readable descriptions stored on computer readable media accessed by a computer processor to cause one or more components, examples of which have been described herein, to perform various operations.

The invention claimed is:

1. A method of monitoring electrical appliances operating on an electrical system, the method comprising:
    calibrating a monitoring unit with an outlet of an electrical system;
    after calibrating the monitoring unit with the outlet of the electrical system, measuring voltage between lines at the outlet engaged by the monitoring unit;
    based on measuring the voltage between lines at the outlet, detecting a voltage change between the lines of the outlet;
    based on detecting the voltage change between the lines of the outlet, recording voltage information measured by the monitoring unit, the recorded voltage information describing at least one of voltage measurement or voltage change;
    based on the recorded voltage information, identifying a voltage or power signature of an appliance operating by receiving power from the electrical system and causing observed changes in voltage;
    based on identification of the voltage or power signature of the appliance, comparing performance data for the appliance to expected performance data for the appliance;
    based on the comparison of the performance data for the appliance to the expected performance data for the appliance, determining whether the performance data for the appliance is within an expected range;
    based on a determination that the performance data for the appliance falls outside of the expected range, identifying a fault condition for the appliance; and
    based on identification of the fault condition for the appliance, issuing, via a computing device, an alert.

2. The method of claim 1, wherein calibrating the monitoring unit with the outlet of the electrical system comprises applying a calibration load having known electrical properties to the electrical system and measuring resulting changes in voltage between the lines of the outlet.

3. The method of claim 1, wherein calibrating the monitoring unit and measuring voltage occurs for each of multiple phases of alternating current of the electrical system.

4. The method of claim 1, wherein calibrating the monitoring unit with the outlet of the electrical system comprises receiving information describing topology of the electrical system and calibrating the monitoring unit based on the received information describing topology of the electrical system.

5. The method of claim 1, wherein measuring voltage between lines at the outlet engaged by the monitoring unit comprises measuring voltage between a hot and neutral line and between a neutral and ground line the outlet.

6. The method of claim 1, wherein identifying the voltage or power signature of the appliance comprises determining the voltage or power signature of the appliance based on calculations performed on collected voltage or power data.

7. The method of claim 1, wherein identifying the voltage or power signature of the appliance comprises comparing collected voltage data or power data to anticipated voltage or power signatures of particular types of appliances.

8. The method of claim 1, wherein comparing performance data for the appliance to expected performance data for the appliance comprises comparing performance data for the appliance to historical information regarding operation of the appliance.

9. The method of claim 1, wherein comparing performance data for the appliance to expected performance data for the appliance comprises comparing performance data for the appliance to anticipated or common voltage or power signatures of fault conditions in appliances.

10. The method of claim 1, wherein comparing performance data for the appliance to expected performance data for the appliance comprises accounting for ancillary information including internal temperature, external temperature, and presence of individuals inside of a monitored property.

11. A system configured to monitor electrical devices, the system comprising:
a monitoring unit configured to monitor voltage between lines of an outlet of an electrical system; and
at least one processor configured to:
calibrate the monitoring unit with the outlet of the electrical system;
after calibrating the monitoring unit with the outlet of the electrical system, measure voltage between lines at the outlet engaged by the monitoring unit;
based on measuring the voltage between lines at the outlet, detect a voltage change between the lines of the outlet;
based on detecting the voltage change between the lines of the outlet, record voltage information measured by the monitoring unit, the recorded voltage information describing at least one of voltage measurement or voltage change;
based on the recorded voltage information, identify a voltage or power signature of an appliance operating by receiving power from the electrical system and causing observed changes in voltage;
based on identification of the voltage or power signature of the appliance, compare performance data for the appliance to expected performance data for the appliance;
based on the comparison of the performance data for the appliance to the expected performance data for the appliance, determine whether the performance data for the appliance is within an expected range;
based on a determination that the performance data for the appliance falls outside of the expected range, identify a fault condition for the appliance; and
based on identification of the fault condition for the appliance, issue, via a computing device, an alert.

12. The system of claim 11, wherein the at least one processor is configured to calibrate the monitoring unit with the outlet of the electrical system by applying a calibration load having known electrical properties to the electrical system and measuring resulting changes in voltage between the lines of the outlet.

13. The system of claim 11, wherein the at least one processor is configured to calibrate the monitoring unit and measure voltage for each of multiple phases of alternating current of the electrical system.

14. The system of claim 11, wherein the at least one processor is configured to calibrate the monitoring unit with the outlet of the electrical system by receiving information describing topology of the electrical system and calibrating the monitoring unit based on the received information describing topology of the electrical system.

15. The system of claim 11, wherein the at least one processor is configured to measure voltage between lines at the outlet engaged by the monitoring unit by measuring voltage between a hot and neutral line and between a neutral and ground line the outlet.

16. The system of claim 11, wherein the at least one processor is configured to identify the voltage or power signature of the appliance by determining the voltage or power signature of the appliance based on calculations performed on collected voltage or power data.

17. The system of claim 11, wherein the at least one processor is configured to identify the voltage or power signature of the appliance by comparing collected voltage data or power data to anticipated voltage or power signatures of particular types of appliances.

18. The system of claim 11, wherein the at least one processor is configured to compare performance data for the appliance to expected performance data for the appliance by comparing performance data for the appliance to historical information regarding operation of the appliance.

19. The system of claim 11, wherein the at least one processor is configured to compare performance data for the appliance to expected performance data for the appliance by comparing performance data for the appliance to anticipated or common voltage or power signatures of fault conditions in appliances.

20. The system of claim 11, wherein the at least one processor is configured to compare performance data for the appliance to expected performance data for the appliance by accounting for ancillary information including internal temperature, external temperature, and presence of individuals inside of a monitored property.

* * * * *